(12) United States Patent
Rathore et al.

(10) Patent No.: US 6,661,302 B1
(45) Date of Patent: Dec. 9, 2003

(54) COMPENSATION ALGORITHM FOR CRYSTAL CURVE FITTING

(75) Inventors: Ammar Yasser Rathore, Emmaus, PA (US); Charles Zimnicki, Bartlett, IL (US)

(73) Assignee: CTS Corporation, Elkhart, IN (US)

( * ) Notice: Subject to any disclaimer, the term of this patent is extended or adjusted under 35 U.S.C. 154(b) by 9 days.

(21) Appl. No.: 10/135,856

(22) Filed: Apr. 30, 2002

Related U.S. Application Data

(60) Provisional application No. 60/287,529, filed on Apr. 30, 2001.

(51) Int. Cl.$^7$ .................................................. H03B 5/32
(52) U.S. Cl. ........................................ 331/158; 331/176
(58) Field of Search ............................... 331/158, 176, 331/44, 177 V, 66, 116 R

(56) References Cited

U.S. PATENT DOCUMENTS

| | | | |
|---|---|---|---|
| 4,270,098 A | * | 5/1981 | Bowman ...................... 331/96 |
| 4,560,959 A | * | 12/1985 | Rokos et al. ................ 331/176 |
| 4,658,223 A | | 4/1987 | Marvin et al. |
| 5,428,319 A | | 6/1995 | Marvin et al. |
| 5,691,671 A | | 11/1997 | Bushman |
| 5,731,742 A | * | 3/1998 | Wojewoda et al. ........... 331/44 |
| 5,760,656 A | | 6/1998 | Sutliff et al. |
| 5,777,524 A | | 7/1998 | Wojewoda et al. |
| 6,549,055 B2 | * | 4/2003 | Rokos ......................... 327/317 |

* cited by examiner

Primary Examiner—Robert Pascal
Assistant Examiner—Joseph Chang
(74) Attorney, Agent, or Firm—Jon Christensen; Steven Weseman; Mark Borgman

(57) ABSTRACT

A method and apparatus are provided for generating a control signal for compensating a temperature controlled crystal oscillator system for changes in an ambient temperature. The method includes the steps of providing a set of second-order coefficients relating ambient temperature to frequency drift over at least a portion of an operating temperature range of the temperature controlled crystal oscillator system and calculating a control signal for compensating the temperature controlled crystal oscillator system for the frequency drift due to the ambient temperature based upon the set of second-order coefficients.

26 Claims, 5 Drawing Sheets

COMPENSATION ALGORITHM FOR CRYSTAL CURVE FITTING

CROSS-REFERENCED TO RELATED APPLICATION

This application claims the benefit of the filing date of U.S. Provisional Application, Ser. No. 60/287,529, filed on Apr. 30, 2001.

FIELD OF THE INVENTION

The field of the invention relates to oscillators and more particularly to temperature controlled crystal oscillators.

BACKGROUND OF THE INVENTION

Temperature controlled crystal oscillators (TCXOs) are generally known. Such devices are typically constructed in the form of a crystal and a controlling chip. Within the chip, a set of switchable capacitors and a feedback amplifier form a tank circuit that oscillates at a frequency determined by the number of capacitors switched into the tank circuit.

A temperature sensor is typically provided within the chip for sensing a temperature in the environs of the crystal. Based upon the temperature, a controller switches capacitors into and out of the tank circuit based upon a performance criteria of the tank circuit which is typically stored in a lookup table within the TCXO chip.

While prior art TCXOs work well, their structure and mode of operation is complex. In order to meet a frequency drift specification, a lookup table of frequency response versus temperature is typically stored within the controller. While the use of a lookup table is effective, the lookup table typically requires a relatively large amount of memory. Accordingly, a need exists for a better method of storing temperature drift characteristics.

SUMMARY

A method and apparatus are provided for generating a control signal for compensating a temperature controlled crystal oscillator system for changes in an ambient temperature. The method includes the steps of providing a set of second-order coefficients relating ambient temperature to frequency drift over at least a portion of an operating temperature range of the temperature controlled crystal oscillator system and calculating a control signal for compensating the temperature controlled crystal oscillator system for the frequency drift due to the ambient temperature based upon the set of second-order coefficients.

DETAILED DESCRIPTION OF A PREFERRED EMBODIMENT

Figure 1:
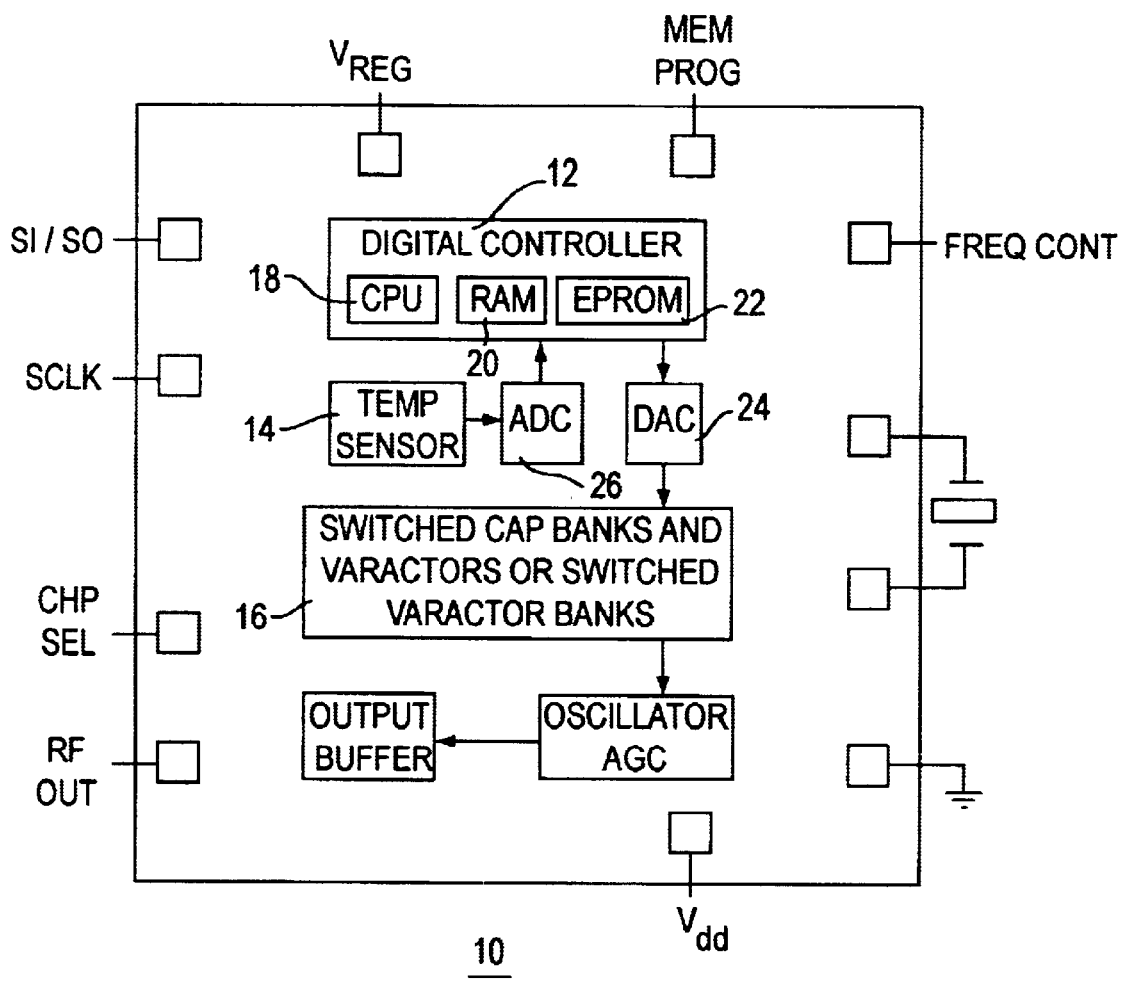
FIG. 1 is a block diagram of a temperature controlled crystal oscillator system in accordance with an illustrated embodiment of the invention.

FIG. 1 is a TCXO chip 10 shown generally in accordance with an illustrated embodiment of the invention. Included within the TCXO 10 may be a digital controller 12, a temperature sensor 14 and oscillator control system 16. The digital controller 12 may contain a central processing unit (CPU) 18, a random access memory (RAM) 20 and electrically programmable read only memory (EPROM) 22. During operation, the CPU 18 may read a temperature from the temperature sensor 14 and retrieve a predetermined set of operating parameters for that temperature from the EPROM 22. The retrieved operating parameter may be used to control frequency drift. As used herein, frequency drift means a frequency change in a TCXO due primarily to temperature change.

Upon retrieving the operating parameters, the CPU 18 may send a set of instructions through the digital to analog converter (DAC) 24 to the oscillator control circuit 16. The instructions may cause the oscillator control circuit 16 to adjust its operating parameters to accommodate its current operating temperature. The imposition of a predetermined set of operating parameters for each temperature may allow the TCXO 10 to operate within a very small frequency deviation (e.g., less than one part per million (ppm)) over a relative broad operating temperature range. As used herein, an operating temperature range refers to a published specification for the TCXO and, more specifically, refers to the temperature range within which the TCXO will perform in accordance with its published specification.

In order to allow the TCXO 10 to conform to its published specifications, the TCXO 10 may be downloaded with one or more tables of temperature dependent operating parameters during manufacture to compensate for temperature changes. As used herein, compensating a TCXO for changes in an ambient temperature means adjusting a tank circuit of the oscillator within the TCXO to allow the TCXO to maintain a relatively constant output frequency over its published operating temperature range.

Once downloaded, the operating parameters may be stored in the EPROM 22 in the form of one or more lookup tables.

The operating parameters may be chosen based upon a temperature versus frequency curve for the temperature controlled crystal oscillator system 10. From the temperature versus frequency curve, a further curve (FIG. 4) may be generated which relates an input signal (from the ADC 26) to an output signal (directed to the DAC 24) at a constant frequency. In effect, FIG. 4 represents a transfer function relating temperature (detected by the sensor 14) to a control signal imposed on the tank circuit through the DAC 24.

Figure 4:
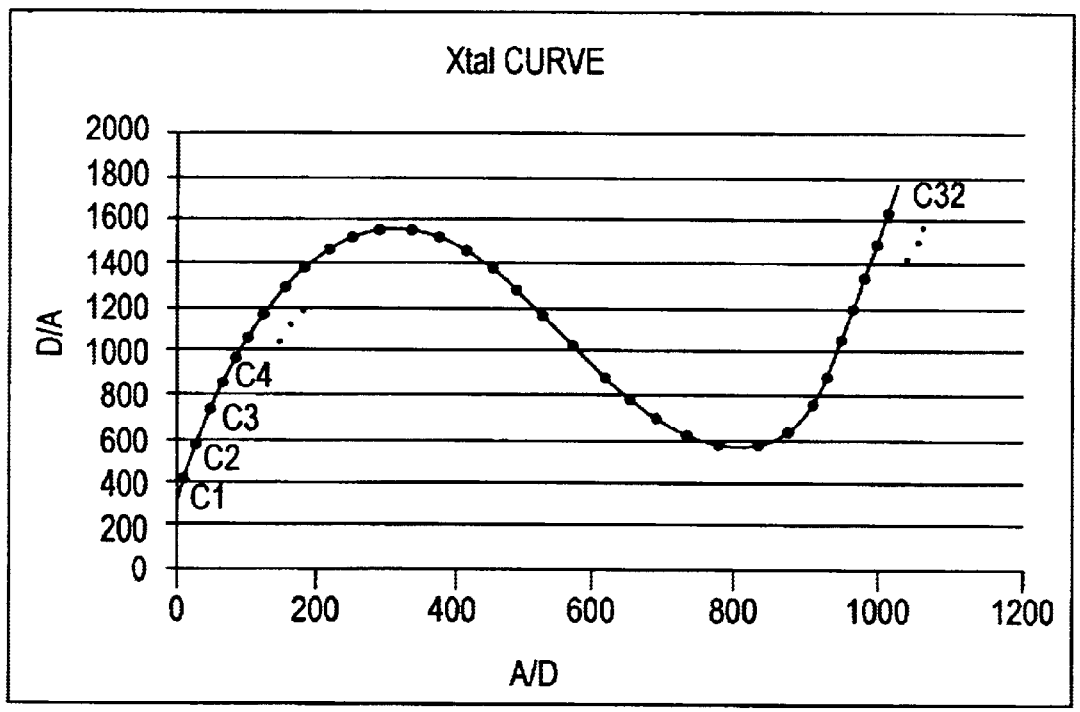
FIG. 4 depicts a transfer function relating temperature to control of the oscillator control circuit of the system of FIG. 1.

While the curve of FIG. 4 could be stored in its entirety in the EPROM 22, the size of such file would be prohibitive. For example, if the ADC 26 has 11 bits (i.e., providing a full scale range of 1,024 possible temperature readings), then the total file size would be at least 11 kilobits.

As an alternative to storing the characteristics of the curve itself, a novel algorithm is provided which generates points along the curve (FIG. 4) based primarily upon second-order coefficients. By imposing the limitations of continuousness and tangency on each successive point along the curve, a much smaller set of second-order coefficients may be used to precisely generate each point along the curve.

In general, the frequency versus temperature characteristics of the TCXO 10 may be corrected by selecting each temperature value (ADC code) and assigning a DAC value corresponding to that value (e.g., as shown in FIG. 4). In the case of the curve of FIG. 4, the ADC 26 may operate over a range of 900 possible temperature values (out of a total of 1024 possible values for an 11-bit ADC). The TCXO operating range may be from 85° C. to −35° C. The total frequency deviation needed to compensate the TCXO 10 over this range may be 30 parts per million (ppm). The DAC 24 may have a range of 2048 values. The maximum possible crystal slope may be 2 ppm. Under these conditions, the performance of the de-compression algorithm may be summarized as follows:

Temperature code step size $$T_{code} = ((85) - (-35))° C.)/900 = 0.133° C./bit.$$

Varactor (DAC) code step size $$V_{code} > (30 \text{ ppm})/° C. = 18(V_{code})/(T_{code}).$$

Slope of the Compensation Curve $$\text{Slope} < 2 \text{ ppm}/° C. = 18(V_{code})/(T_{code}).$$

Turning now to the curve of FIG. 4, an explanation will be provided of the method used to compress the information of the curve into a lookup table of coefficients. Following the explanation of compression, an explanation will be offered in the use of those coefficients.

With reference to FIG. 4, the curve may be split into two equal segments of 512 points each around the zero ppm crossing points. One point may be chosen (e.g., the zero ppm crossing point) from the first segment as the initial point, called the middle point. The magnitude of the middle point may be used as the zero-order coefficient. Compression may begin from one point on either side of the middle point. In essence, the middle point is not included in subsequent compression steps. It is only used to compute the first order coefficients extending either direction from the middle point. Once the zero and first-order coefficients are determined, the segments may be divided into 16 portions each (about 3.7° C./portion).

Next, for each portion adjacent to and extending outwards from the middle point, a second-order polynomial (parabola) as follows, $$V_i = a + bT + cT^2,$$

is fitted to the curve portion, where V is the varactor code (DAC value) and T is the temperature code (ADC value). The zero, first and second-order coefficients (a, b, c) may then be stored in the lookup tables 60, 62, 64 in conjunction with the corresponding temperature code from the ADC 26.

Subsequent portions may be processed in order (i.e., proceeding from one adjacent portion to the next) from the middle point. The subsequent portions are each fitted to the second order polynomial, keeping all portions continuous and tangent. The constraint of continuity eliminates the need to store any further zero-order coefficients ($a_1, a_2, a_3, \ldots$). The constraint of tangency eliminates the need to store any further first-order coefficients ($b_1, b_2, b_3, \ldots$). For each case, a second-order coefficient (c) may be stored in the second order coefficient lookup table 64 in conjunction with a corresponding temperature code.

Using the process described above, only a single zero-order and a single first-order coefficient are required. Since the curve has 32 portions, 32 second-order coefficients are required. Since the zero-order coefficient would have 11 bits, the first-order coefficient 13 bits and the second-order coefficients 10 bits, respectively, total storage requirements for the compressed lookup table is 344 bits. In contrast, storing the table of FIG. 4 under the prior art would require 1024 words of 11 bits each, yielding a net reduction in memory size of 10,920 bits.

Figure 2:
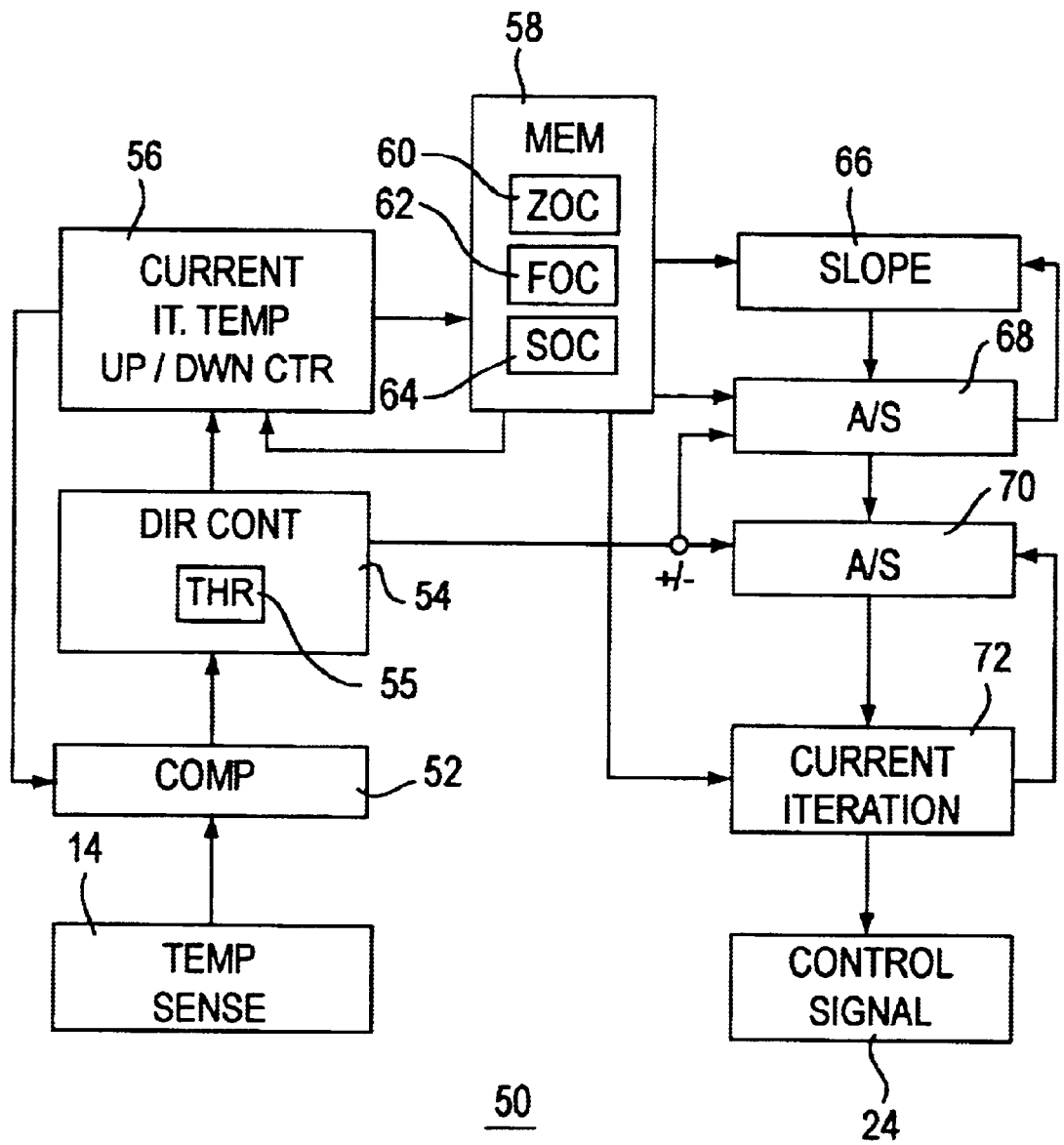
FIG. 2 depicts a compensation state control engine that may be used by the system of FIG. 1.
Figure 3:
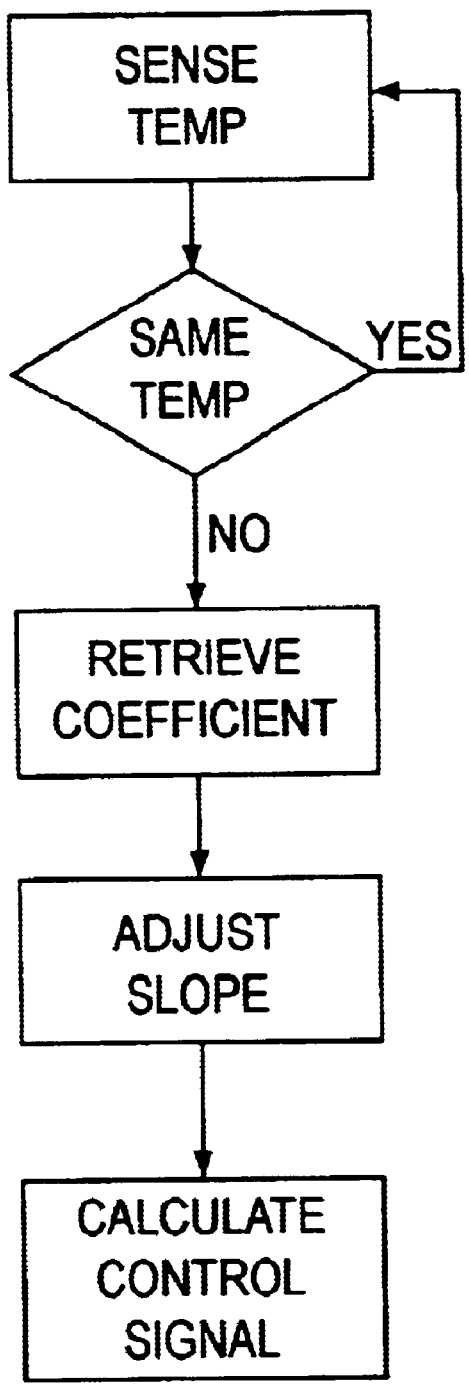
FIG. 3 depicts a flow chart of method steps that may be used by the system of FIG. 1.

Turning now to the TCXO 10, in general, an explanation will be provided of temperature compensation using the lookup tables generated above. FIG. 2 depicts a compensation state engine 50 that may operate within the CPU 18. FIG. 3 depicts method steps that may be used in conjunction with the engine 50. Reference shall be made to FIGS. 2 and 3 as appropriate to an understanding of illustrated embodiments of the invention.

The compensation engine 50 may be initialized by loading curve coefficients (a, b, c) values from memory 58 (EPROM 22) for a starting point. An up/down (U/D) counter 56 may be loaded with a starting temperature. A current iteration register 72 may be loaded with a zero-order coefficient of the starting point. In the case where the starting temperature is one of the points of FIG. 4 having zero slope, the zero-order coefficient may also represent the control word provided by the DAC 24 to the controller 16 at the starting temperature.

A slope register 66 may be loaded with a first-order coefficient of the starting point. Again, where the starting temperature is selected at one of the zero slope positions shown in FIG. 4, the loaded value may be zero.

Following initialization, the state engine 50 may iterate from the starting temperature towards the ambient temperature, as detected by the sensor 14, one bit at a time. At each step, a currently processed temperature (current temperature) is compared with the ambient temperature in a comparator 52. If the current temperature is less than the ambient temperature, then a count controller 54 increments the current temperature to a next higher (new) value. If the current temperature is greater than the ambient temperature, then a count controller 54 decrements the current temperature to a next lower (new) value.

In conjunction with incrementing or decrementing the current temperature, a new iterated control value is determined. To determine the new iterated control value a second-order coefficient associated with the new current temperature contained within the counter 56 is retrieved from memory 58 and loaded into adder/subtractor (A/S) 68. Within the A/S 68, the second-order coefficient is added or subtracted from the first-order coefficient. If the current temperature 56 was incremented, then the second-order coefficient is added to the first order coefficient. If the current temperature 56 was decremented, then the second-order coefficient is subtracted from the first order coefficient.

In either case, the result of the add/subtract operation (value change) is loaded as a new first-order coefficient into the slope register 66 and also provided as an input to a second A/S 70. Within the second A/S 70 the value change is added or subtracted from the iterative control value contained in iteration register 72 to provide a new iterative control value. As above, if the current temperature 56 was incremented, then the value change is added to the iterative value. If the current temperature 56 was decremented, then the value change is subtracted from the iterative control value. The new iterative control value is then loaded as a current iteration value into iteration register 72. The current iteration value may then be provided as the control signal from the DAC 24 to the controller 16.

Once the new iterative value is loaded as a current iteration value into the iteration register 72, the process may repeat. The current temperature in register 56 may again be compared with the ambient temperature. A difference may again be detected and again used to increment or decrement the counter 56. Incrementing or decrementing the counter may be used to retrieve a new second order coefficient to adjust the slope and current iteration value in register 72.

Eventually, the current temperature within register 56 may substantially equal the ambient temperature. When the current temperature reaches the ambient temperature, the current temperature may be allowed to cycle above and below the ambient temperature or the direction controller 54 may be provided with a threshold value 55 to disable the direction controller 54 in cases where a difference between the current temperature and ambient temperature is within the threshold value 55.

It should be noted in passing that while the iterative value within the iterative register 72 may change with each change in the current temperature, each change in the current temperature may not always result in the retrieval of a different second-order coefficient. For example, FIG. 4 was divided into 32 curve portions. Since the curve had 900 possible temperature readings, each curve portion relates to a temperature range of approximately 28 readings. As such, for the example provided, a different second-order coefficient would be retrieved only after about 28 iterations.

Figure 5:
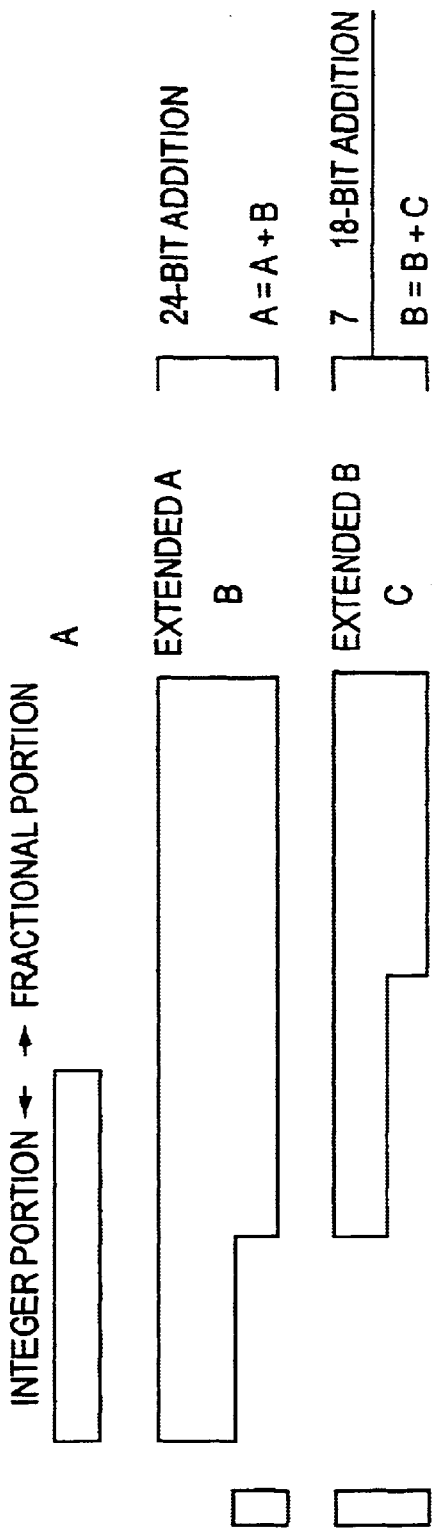
FIG. 5 depicts pictorially the generation of the control signals used by the system of FIG. 1.

FIG. 5 provides a pictorial example of the iterative generation of the control signals. As shown on a top row, the iterative value A may be an integer value. The slope B and second-coefficients C may have an integer and fractional value and may have a sign bit (as shown on the far left).

As should be apparent from FIG. 5 and the above description, once the iterative process has begun, generation of control signals is based primarily upon second order coefficients. Further, a starting temperature may be established at any level by using an iterative value and slope determined for that temperature and stored as zero and first-order coefficients, respectively.

A specific embodiment of a method and apparatus for generating a temperature compensated control signal for a TCXO according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

What is claimed is:

1. A method of generating a control signal for compensating a temperature controlled crystal oscillator system for changes in an ambient temperature, such method comprising the steps of:
   providing a set of second-order coefficients relating ambient temperature to frequency drift over at least a portion of an operating temperature range of the temperature controlled crystal oscillator system; and
   calculating a control signal for compensating the temperature controlled crystal oscillator system for the frequency drift due to the ambient temperature based upon the set of second-order coefficients.

2. The method of generating a control signal as in claim 1 further comprising providing a first iterative value associated with a first temperature and a first second-order coefficient of the set of second-order coefficients, said first second-order coefficient being associated with a second temperature adjacent the first temperature.

3. The method of generating a control signal as in claim 2 further comprising adjusting a slope associated with the first iterative value by the first second-order coefficient.

4. The method of generating a control signal as in claim 3 wherein the step of calculating the control signal further comprises adding the adjusted slope to the first iterative value when the second temperature exceeds the first temperature and subtracting the adjusted slope from the first iterative value when the first temperature exceeds the second temperature to provide a second iterative value at the second temperature.

5. The method of generating a control signal as in claim 4 wherein the step of calculating the control signal further comprises retrieving a zero-order coefficient associated with a first predetermined temperature.

6. The method of generating a control signal as in claim 5 wherein the step of calculating the control signal further comprises retrieving a first-order coefficient associated with the zero-order coefficient and the first predetermined temperature.

7. The method of generating a control signal as in claim 6 further comprising using the zero-order coefficient at the first predetermined temperature as the first iterative value at the first temperature first following activation of the temperature controlled crystal oscillator system.

8. The method of generating a control signal as in claim 7 further comprising measuring the ambient temperature in an environs of the temperature controlled crystal oscillator.

9. The method of generating a control signal as in claim 8 further comprising:
   a) comparing the ambient temperature with the first temperature;
   b) retrieving the first second-order coefficient when the ambient temperature exceeds the first temperature;
   c) redefining the second iterative value at the second temperature as the first iterative value at the first temperature for a subsequent iteration; and
   d) repeating step a-c until the second temperature equals the ambient temperature.

10. An apparatus for generating a control signal for compensating a temperature controlled crystal oscillator system for changes in an ambient temperature, such apparatus comprising:
   means for providing a set of second-order coefficients relating ambient temperature to frequency drift over at least a portion of an operating temperature range of the temperature controlled crystal oscillator system; and
   means for calculating a control signal for compensating the temperature controlled crystal oscillator system for the frequency drift due to the ambient temperature based upon the set of second-order coefficients.

11. The apparatus for generating a control signal as in claim 10 further comprising means for providing a first iterative value associated with a first temperature and a first second-order coefficient of the set of second-order coefficients, said first second-order coefficient being associated with a second temperature adjacent the first temperature.

12. The apparatus for generating a control signal as in claim 11 further comprising means for adjusting a slope associated with the first iterative value by the first second-order coefficient.

13. The apparatus for generating a control signal as in claim 12 wherein the means for calculating the control signal further comprises means for adding the adjusted slope to the first iterative value when the second temperature exceeds the first temperature and subtracting the adjusted slope from the first iterative value when the first temperature exceeds the second temperature to provide a second iterative value at the second temperature.

14. The apparatus for generating a control signal as in claim 13 wherein the means for calculating the control signal further comprises means for retrieving a zero-order coefficient associated with a first predetermined temperature.

15. The apparatus for generating a control signal as in claim 14 wherein the means for calculating the control signal further comprises means for retrieving a first-order coefficient associated with the zero-order coefficient and the first predetermined temperature.

16. The apparatus for generating a control signal as in claim 15 further comprising means for using the zero-order coefficient at the first predetermined temperature as the first iterative value at the first temperature first following activation of the temperature controlled crystal oscillator system.

17. The apparatus for generating a control signal as in claim 16 further comprising means for measuring the ambient temperature in an environs of the temperature controlled crystal oscillator.

18. The apparatus for generating a control signal as in claim 17 further comprising:
a) means for comparing the ambient temperature with the first temperature;
b) means for retrieving the first second-order coefficient when the ambient temperature exceeds the first temperature;
c) means for redefining the second iterative value at the second temperature as the first iterative value at the first temperature for a subsequent iteration; and
d) means for repeating step a-c until the second temperature equals the ambient temperature.

19. An apparatus for generating a control signal for compensating a temperature controlled crystal oscillator system for changes in an ambient temperature, such apparatus comprising:
a memory adapted to provide a set of second-order coefficients relating ambient temperature to frequency drift over at least a portion of an operating temperature range of the temperature controlled crystal oscillator system; and
a compensation state engine adapted to calculate a control signal for compensating the temperature controlled crystal oscillator system for the frequency drift due to the ambient temperature based upon the set of second-order coefficients.

20. The apparatus for generating a control signal as in claim 19 further comprising a current temperature register adapted to provide a first iterative value associated with a first temperature and a first second-order coefficient of the set of second-order coefficients, said first second-order coefficient being associated with a second temperature adjacent the first temperature.

21. The apparatus for generating a control signal as in claim 20 further comprising a first adder/subtractor adapted to adjust a slope associated with the first iterative value by the first second-order coefficient.

22. The apparatus for generating a control signal as in claim 21 wherein the first adder/subtractor further comprises a second adder/subtractor adapted to add the adjusted slope to the first iterative value when the second temperature exceeds the first temperature and subtract the adjusted slope from the first iterative value when the first temperature exceeds the second temperature to provide a second iterative value at the second temperature.

23. The apparatus for generating a control signal as in claim 22 further comprising a temperature sensor adapted to measure the ambient temperature in an environs of the temperature controlled crystal oscillator.

24. The apparatus for generating a control signal as in claim 19 further comprising:
a) a comparator adapted to compare the ambient temperature with the first temperature;
b) a current temperature register adapted to retrieve the first second-order coefficient when the ambient temperature exceeds the first temperature; and
c) an iterative register adapted to redefine the second iterative value at the second temperature as the first iterative value at the first temperature for a subsequent iteration.

25. A method of generating a control signal for compensating a temperature controlled crystal oscillator for an ambient temperature, such method comprising the steps of:
compressing a frequency versus temperature response curve of the temperature controlled crystal oscillator into a set of second-order coefficients;
detecting a temperature of an environ of the temperature controlled crystal oscillator system; and
calculating the control signal for compensating the temperature controlled crystal oscillator based upon the determined temperature and the set of second-order coefficients.

26. A method of generating a control signal for compensating a temperature controlled crystal oscillator system for an ambient temperature, such method comprising the steps of:
determining a plurality of frequency change versus temperature parameters over an operating temperature range of the temperature controlled crystal oscillator system;
compressing the determined frequency change versus temperature parameters into a set of second-order coefficients;
calculating a control signal for compensating the temperature controlled crystal oscillator system for an ambient temperature based upon the set of second-order coefficients.

* * * * *